US011228877B2

(12) United States Patent
Leung

(10) Patent No.: US 11,228,877 B2
(45) Date of Patent: Jan. 18, 2022

(54) ELECTRONIC NET FOR SECURITY DURING TRANSPORTATION AND WEAVING METHOD THEREFOR

(71) Applicant: AUTOTOLL INTERNATIONAL LIMITED, Hong Kong (CN)

(72) Inventor: Ka Lai Owen Leung, Hong Kong (CN)

(73) Assignee: AUTOTOLL INTERNATIONAL LIMITED, Kowloon (HK)

( * ) Notice: Subject to any disclaimer, the term of this patent is extended or adjusted under 35 U.S.C. 154(b) by 0 days.

(21) Appl. No.: 17/252,979

(22) PCT Filed: Jul. 13, 2020

(86) PCT No.: PCT/IB2020/056537
§ 371 (c)(1),
(2) Date: Dec. 16, 2020

(87) PCT Pub. No.: WO2021/009647
PCT Pub. Date: Jan. 21, 2021

(65) Prior Publication Data
US 2021/0120382 A1    Apr. 22, 2021

(30) Foreign Application Priority Data

Jul. 15, 2019 (HK) .................. 19126827.5

(51) Int. Cl.
*H04W 4/35* (2018.01)
*H04W 4/42* (2018.01)
*H04W 4/029* (2018.01)
*G01R 31/54* (2020.01)
(Continued)

(52) U.S. Cl.
CPC .............. *H04W 4/35* (2018.02); *B65D 19/38* (2013.01); *B65D 71/0096* (2013.01);
(Continued)

(58) Field of Classification Search
CPC ............ G06Q 10/0833; B65D 2401/00; B65D 27/30; G09F 3/0329; G09F 3/0352;
(Continued)

(56) References Cited

U.S. PATENT DOCUMENTS 5,656,996 A * 8/1997 Houser .............. G08B 13/1454
340/541
8,974,158 B1 * 3/2015 Hatch .................. B60P 7/0876
410/44

(Continued)

*Primary Examiner* — Dung Hong
(74) *Attorney, Agent, or Firm* — Muncy, Geissler, Olds & Lowe, P.C.

(57) ABSTRACT

The present invention provides an electronic net for security during transportation, whereas the net body of electronic net is knitted with a braided wire which has a conductive wire inside, or even it is formed by multiple subnets and the conductive wires between subnets are connected in series. Both metal ends of conductive wire of the net body are connected to electronic lock. If the conductive wire in the braided wire is disconnected due to the damage of net body, the electronic lock rapidly detect the error. Even though the disconnected conductive wire is reconnected again, the error record in the electronic lock cannot be eliminated. Therefore, once the goods finish the X-ray security check, it is covered with the electronic net and locked to the bottom plate with fixing belt, and then identify it with the strap before transportation. And the staff needs to check the electronic lock if there is any error signal and observe the identifiers of the straps if they are consistent with the record and damaged or not As above to complete the inspection of the security problems in transportation. The process is simple and reduces the security loopholes caused by negligence.

7 Claims, 2 Drawing Sheets

(51) Int. Cl.
*B65D 19/38* (2006.01)
*B65D 71/00* (2006.01)
*D03D 1/00* (2006.01)
*D03D 9/00* (2006.01)
*G01S 19/42* (2010.01)
*G07C 9/00* (2020.01)

(52) U.S. Cl.
CPC .............. *D03D 1/0088* (2013.01); *D03D 9/00* (2013.01); *G01R 31/54* (2020.01); *G01S 19/42* (2013.01); *G07C 9/00896* (2013.01); *H04W 4/029* (2018.02); *H04W 4/42* (2018.02); *G07C 2009/0092* (2013.01)

(58) Field of Classification Search
CPC .............. H05K 1/0275; H05K 5/0208; H05K 2201/10151; H05K 1/028; H05K 1/09; H05K 5/03; G06F 21/86; G08B 13/06
See application file for complete search history.

(56) References Cited

U.S. PATENT DOCUMENTS

| | | | | |
|---|---|---|---|---|
| 10,282,951 | B1* | 5/2019 | Kulick | A47G 29/20 |
| 2005/0232747 | A1* | 10/2005 | Brackmann | B60P 3/14 |
| | | | | 414/803 |
| 2007/0163365 | A1* | 7/2007 | Reed | G01L 1/205 |
| | | | | 73/862 |
| 2007/0188322 | A1* | 8/2007 | English | G06Q 10/08 |
| | | | | 340/539.26 |
| 2008/0291019 | A1* | 11/2008 | Auerbach | G08B 13/126 |
| | | | | 340/542 |
| 2014/0091931 | A1* | 4/2014 | Cova | G08B 13/12 |
| | | | | 340/568.2 |
| 2020/0051015 | A1* | 2/2020 | Davis | G06Q 50/28 |
| 2020/0160263 | A1* | 5/2020 | Kuettner | G06Q 10/0832 |
| 2020/0250611 | A1* | 8/2020 | Pourteymour | H04W 4/029 |
| 2020/0357262 | A1* | 11/2020 | Walsh | G08B 13/126 |

* cited by examiner

ELECTRONIC NET FOR SECURITY DURING TRANSPORTATION AND WEAVING METHOD THEREFOR

TECHNICAL FIELD

The invention involves a type of electronic net which can detect whether the net body is damaged, in particular a type of electronic net used to ensure the transportation security.

BACKGROUND ART

It is necessary to proceed X-ray inspection for cargo transportation at the airport, especially for air exported cargo to meet the security requirement. Generally most of the national airports set a freight center with the X-ray inspection equipment for security inspection to all the goods to be transported by air. After security inspection, the cargo will be directly transported to cargo plane for transportation. The airports with large freight volume setups a corresponding scale freight center in order to temporarily store the goods. However, in some countries or regions, such as Hong Kong, the limited area of the airport cannot meet the needs of large volume of air cargo. Therefore, it is necessary to inspect the cargo security outside the airport, and then transport the goods to airport for air freight by truck after security inspection. In order to avoid the security loopholes in the process of transportation after security inspection, it is necessary to take specific security measures, including using rope net to fix the goods, and using lock with special disposable label to fix the rope net in order to prevent any goods from being replaced or inserted without security check during transportation. After transportation, the staff should inspect the packing to find out whether the rope net and the lock have any damage. However, the above security inspections are very cumbersome and inefficient in the actual operation process. And due to the omissions of manual inspection, It is unable to effectively eliminate security loopholes in the transportation.

SUMMARY OF INVENTION

In the view of the above shortage of the existing technologies, the invention provides a electronic net for security during transportation In coordination of the electronic lock and electronic net, which can rapidly inspect any damage of the electronic net during transportation and simplify the airport inspection of transportation security to improve the work efficiency, reduce the omissions by manual inspection, and effectively eliminate the security loopholes in the transportation.

In addition, the invention also provides a weaving method of the electronic net which uses braided wire with conductive wire knit the electronic net.

An electronic net for security during transportation, whereas includes a net body which is woven by a braided wire; a conductive wire is buried along the braided wire; both metal ends of the conductive wire are connected to an electronic lock respectively, the net body wholly covers the transported goods; a fixing belt goes through the meshes at the edge of the net body in turn, and fixes to a bottom plate for placing goods; an anti-disassembly strap is set along the fixing belt at specified space intervals, the strap goes through the bottom plate, fixing belt and/or the meshes at the edge of the net body, the strap is provided with a unique identifier, the security settings applied to the electronic net before transportation are as following:

a. Load the goods to be transported to the bottom plate, and lock the fixing belt to the bottom plate;

b. Cover the electronic security net to the goods, and connect the meshes at the edge of net body, fasten to the fixing belt at the bottom of goods, then put one of metal ends into hole of buckle of fixing belt;

c. Set the anti-disassemble strap along the fixing belt at specified space intervals, and record the identifier for all the straps;

d. Connect both metal ends of the conductive wire in the braided wire to the electronic lock, and activate the electronic lock to detect whether the conductive wire is disconnected or not;

The following inspection items are carried out to verify the electronic security net after transportation:

c. Check if there is any error code of the electronic lock, which is caused by the disconnection of conductive wire;

d. Check if the identifiers of all the straps are consistent with the record and inspect the integrity of the straps;

If the above inspection items are passes, the security of transport process of the goods is confirmed, otherwise, it is believed that there is security problem during transportation and the goods is accepted.

Furthermore, the braided wire at least includes an insulating braided outer layer and the conductive wire; and the outer layer is elastic to wrap the conductive wire inside.

Furthermore, the net body of electronic net is formed by connecting multiple subnets, the meshes at the edge of the adjacent subnets are cross woven and connected to each other, the conductive wires between subnets are connected in series, and the connection position is fixed by a sleeve; the end of the conductive wire of the first subnet and the end of the conductive wire of the last subnet are connected to the electronic lock.

Furthermore, the edge of the adjacent subnet is fixed by inserting and knotting with a braided wire along the meshes, and the conductive wire of the braided wire is also inserted to the conductive wire of the subnet.

Furthermore, the electronic lock is at least provided with a detection circuit for checking if the connection end is conductive, with the connection between the detection circuit and the electronic net, the conductive wire of the electronic net forms a loop, and when the electronic lock activates, the detection circuit outputs electrical signal to detect the loop, and sends out the corresponding error signal if the interruption occurs.

Furthermore, the electronic lock is provided with a satellite positioning circuit and a communication circuit, the communication circuit connects to satellite positioning circuit to obtain the positioning data, and it also connects to detection circuit to obtain fault signal, the communication circuit transmits the positioning data and error signal to the remote server by wireless network.

A weaving method of the electronic net for security during transportation, whereas the net body of the electronic net is of interlaced by the meshes and the knots between adjacent meshes, the weaving methods are as below:

a. Loop the braided thread to form the first mesh and tie it with a knot;

b. Loop the braided thread and get through the previous mesh to form a new mesh, and then tie a knot at the position where the braided thread passes the previous mesh to fix the new mesh to the previous mesh;

c. Repeat the step b to complete a row of mesh and knot structure;

d. Loop the braided thread along the vertical direction of the previous row of mesh and get through the corresponding mesh of the previous row to form a new mesh, and then tie a knot at the position where the braided thread passes the corresponding mesh of the previous row so as to fix the new mesh to the corresponding mesh of the previous row; loop the braided thread and get through the corresponding mesh of previous row and the adjacent mesh in the same row to form a new mesh, and then tie a knot at the position where the braided thread passes the corresponding mesh of the previous row and the adjacent mesh in the same row to fix the new mesh to the corresponding mesh of the previous row and the adjacent mesh in the same row;

e. Repeat the step d to complete the net body.

The invention has the following advantageous effects: the net body of electronic net is knitted with a braided wire which has a conductive wire inside, or even it is formed by multiple subnets and the conductive wires between subnets are connected in series. Both ends of conductive wire of the net body are connected to electronic lock. If the conductive wire in the braided wire is disconnected due to the damage of net body, the electronic lock rapidly detect the error. Even though the disconnected conductive wire is reconnected again, the error record in the electronic lock and backend server cannot be eliminated. Therefore, once the goods finish the X-ray security check, it is covered with the electronic net and locked to the bottom plate with fixing belt, and then identify it with the strap before transportation. And the staff needs to check the electronic lock if there is any error signal and observe the identifiers of the straps if they are consistent with the record and damaged or not As above to complete the inspection of the security problems in transportation. The process is simple and reduces the security loopholes caused by negligence.

DESCRIPTION OF DRAWINGS

Below are explanations of the invention combining with drawings.

DETAILED DESCRIPTION OF THE INVENTION

Figure 1:
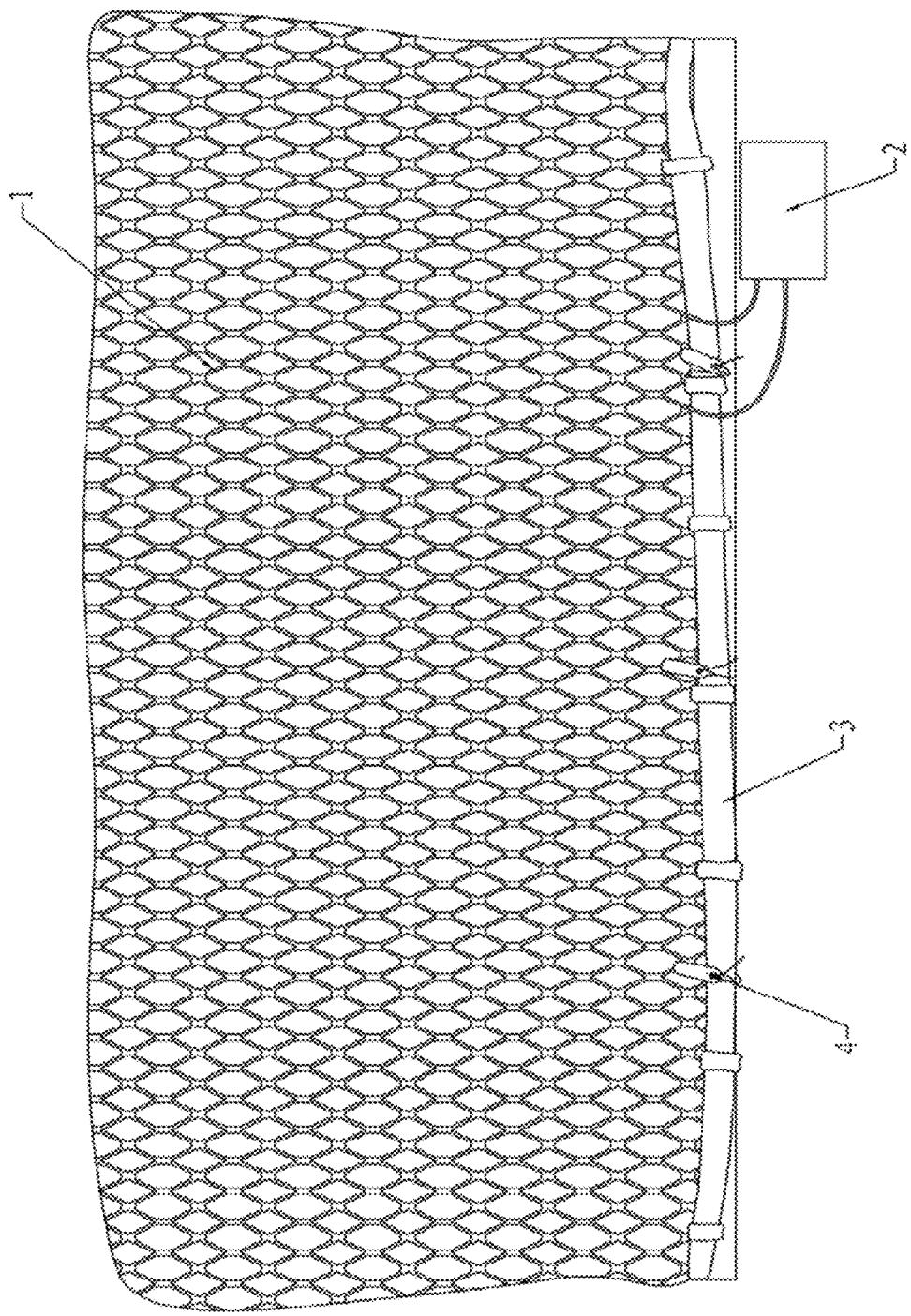
FIG. 1: The schematic diagram of the present invention.

Refer to FIG. 1, the electronic net for security during transportation, includes a net body 1 which is woven by a single braided wire; a conductive wire is buried along the braided wire; both metal ends of the conductive wire are connected to an electronic lock respectively. When is activated, the ports of the electronic lock output the corresponding signal and is connected by conductive wire. Once the conductive wire is broken and the ports loss connection, the electronic lock 2 regards the net body 1 is disassembled and send out an error signal. Even though the broken conductive wire is reconnected, the electronic lock 2 will still keep the error signal record. And the staff can judge whether the electronic network has security problems by observing if any error record of the electronic lock 2.

In order to prevent the short circuit and tempering of the conductive wire in the braided wire and lead to the security loopholes, the braided wire is composed of an insulation braided outer layer and inner conductive wire. The insulating braided outer layer is generally braided outside the conductive wire with a stronger braided wire. On the one hand, it can act as insulation. And on the other hand, it can improve the tensile performance of the braided wire, and prevent the conductive wire from being torn open easily in use. As the braided wire needs to be knitted to form the net body 1, and be distorted during weaving, the outer layer of insulating braided is elastic to meet the needs. Also, there are certain requirements for the performance of the conductive wire, such as the tensile property and electrical conductivity. For the electrical conductivity, the total electrical resistivity of the braided electronic net should be less than 30 KΩ, and 10-15 KΩ is preferred. Because the higher resistivity will affect the signal transmissions of the ports of electronic lock 2 and would cause the electronic net not working properly.

Figure 2:
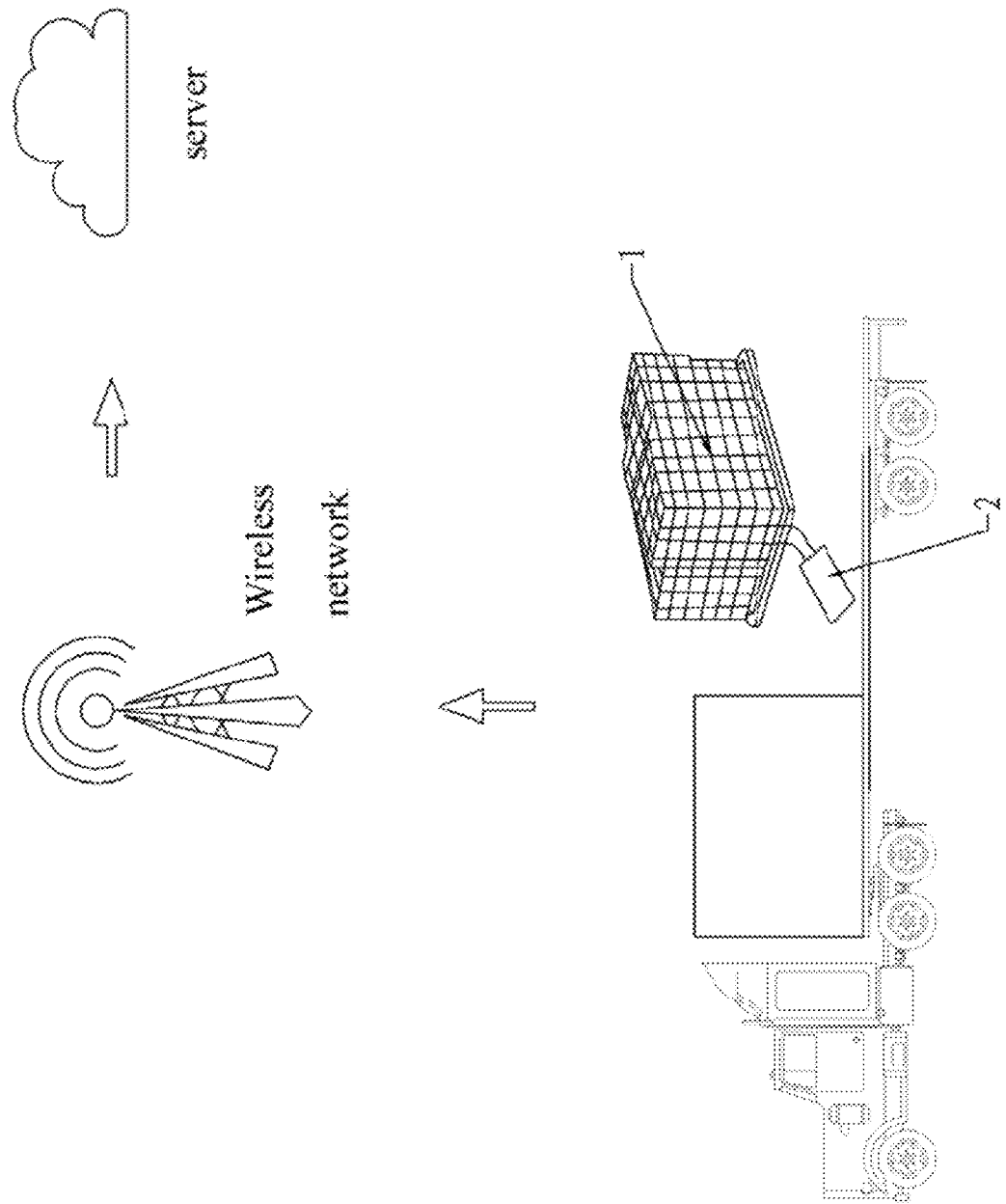
FIG. 2: The schematic diagram of monitoring the transportation of the present invention In the figures: 1. Net body, 2. Electronic lock, 3. Fixing belt, 4. Strap.

Electronic lock 2 is provided with a detection circuit for detecting the connection of both metal ends. The detection circuit form a loop with the conductive wire of the electronic net when the electronic lock 2 activate, the detection circuit will output the electrical signal to the electronic net and detect whether the loop is interrupted or the conductive wire is broken. Once the interruption occurs, the error signal will be sent out. In the meanwhile, refer to FIG. 2, for monitoring transportation route of the cargo during transportation and monitoring the situation of the electronic net in time, the electronic lock 2 is also provided with a positioning circuit, such as Global Position System (GPS) and communication circuit, such as low-power wide-area network (LoRa). The communication circuit connects to satellite positioning circuit for obtaining the positioning data. And it also connects to the detection circuit to get the status, such as if any error signal occurs. And then the communication circuit transmits the positioning data and the error signal to the remote server by wireless network, for example, the LoRa function detects if the electronic lock has been separated from authorized vehicle or assigned location. The server will store and monitor the above data and the error signal. Once a problem, the server informs the relevant staff to deal with it in time.

In order to fix the electronic net to the bottom plate for placing goods, the fixing belt 3 is necessary. The fixing belt 3 goes through the meshes at the edge of the net body 1 and fix to the bottom plate. Generally, a connecting buckle for fixing the fixing belt 3 to the bottom plate is necessary. The fixing belt 3 goes through the connecting buckle and fixes to the bottom plate. In order to prevent the security loopholes caused by the destruction or replacement of the fixing belt 3, an anti-disassemble strap should be set along the fixing belt 3 at specified space intervals. The strap 4 goes through the bottom plate, fixing belt 3 and/or the meshes at the edge of net body 1, so as to prevent the fixing belt 3 from being removed or replaced. At the same time, each strap 4 has a unique identifier to prevent being replaced.

When the goods are transported to the airport after the X-ray security inspection, the following steps are necessary to ensure security:

a. Load the goods to be transported on the bottom plate, and lock the fixing belt 3 to the bottom plate.

b. Cover the goods with the electronic security net, and fasten the fixing belt 3 at the bottom of goods, then put one of metal ends into hole of buckle of fixing belt; the meshes at the edge of net body 1.

c. Set the anti-disassemble strap 4 along the fixing belt 3 at specified space intervals, and record the identifiers of all the straps 4.

d. Connect both metal ends of the conductive wire in the braided wire to the electronic lock 2, and activate the electronic lock 2 via RFID or backend server to detect whether the conductive wire is disconnected or not.

When the goods arrive at the airport and complete the transportation, the staff carry out the following inspection to verify the electronic security net.

a. Check if the electronic lock 2 has any error signal which is caused by the disconnection of conductive wire.

b. Check if the identifiers of all the straps 4 are consistent with the record and inspect the integrity of the strap 4.

If passing the above inspection, the security of the goods transportation is confirmed, otherwise, the goods will not be accepted for any security problems existing in the transportation. The process is simple and reduces the security loopholes caused by negligence.

Further, if there are lots of goods and a signal electronic net cannot fully cover all the goods, the net body 1 of electronic net is formed by connecting multiple subnets, the meshes at the edge of the adjacent subnets are cross woven and connected to each other, the conductive wires between subnets are connected in series, and the connection position is fix by a sleeve; the end of the conductive wire of the first subnet and the end of the conductive wire of the last subnet are connected to the electronic lock 2. In addition, in order to strengthen the connection between the subnets, the edge of the adjacent subnets is fastened by inserting and knotting with braided wire along the meshes. And the conductive wire of the braided wire is also inserted to the conductive wire of the subnet.

The net body 1 of the electronic net is formed by interlacing of the meshes and the knots between adjacent meshes. The weaving methods are shown below:

a. Loop the braided thread to form the first mesh and tie it with a knot.

b. Loop the braided thread and get through the previous mesh to form a new mesh, and then tie a knot at the position where the braided thread passes the previous mesh to fix the new mesh to the previous mesh.

c. Repeat the step b to complete a row of mesh and knot structure.

d. Loop the braided thread along the vertical direction of the previous row of mesh and get through the corresponding mesh of the previous row to form a new mesh, and then tie a knot at the position where the braided thread passes the corresponding mesh of the previous row so as to fix the new mesh to the corresponding mesh of the previous row; loop the braided thread and get through the corresponding mesh of previous row and the adjacent mesh in the same row to form a new mesh, and then tie a knot at the position where the braided thread passes the corresponding mesh of the previous row and the adjacent mesh in the same row to fix the new mesh to the corresponding mesh of the previous row and the adjacent mesh in the same row.

e. Repeat the step d to complete the net body 1.

In order to prevent the goods from being stolen through the big meshes of the electronic net, the mesh size is generally about 4 CM. The knot of electronic net is also relatively loose to make the whole electronic net have better elasticity that can be adjusted according to the contact position with the goods.

The invention claimed is:

1. An electronic net for security during transportation, including:

a net body which is woven by a braided wire;

a conductive wire which is buried along the braided wire, wherein both metal ends of the conductive wire are connected to an electronic lock respectively and for sealing, the net body wholly covers the transported goods;

a fixing belt which goes through the meshes at the edge of the net body in turn, and fixes to a bottom plate for placing goods;

an anti-disassembly strap which is set along the fixing belt at specified space intervals, wherein the strap goes through the bottom plate, fixing belt and/or the meshes at the edge of the net body, the strap is provided with a unique identifier; and wherein a security settings applied to the electronic net before transportation are as following:

a. loading the goods to be transported to the bottom plate, and lock the fixing belt to the bottom plate;

b. covering the electronic security net to the goods, and connect the meshes at the edge of net body, fasten the fixing belt at the bottom of goods, then put one of metal ends into hole of buckle of fixing belt;

c. setting the anti-disassemble strap along the fixing belt at specified space intervals, and record the identifier for all the straps;

d. connecting both metal ends of the conductive wire in the braided wire to the electronic lock, and activate the electronic lock to detect whether the conductive wire is disconnected or not;

wherein the following inspection items are carried out to verify the electronic security net after transportation:

a. checking if there is any error code of the electronic lock, which is caused by the disconnection of conductive wire;

b. checking if the identifiers of all the straps are consistent with the record and inspect the integrity of the straps;

wherein the above inspection items are passes, the security of transport process of the goods is confirmed, otherwise, it is believed that there is security problem during transportation and the goods is accepted.

2. The electronic net for security during transportation of claim 1, wherein the braided wire at least includes an insulating braided outer layer and the conductive wire; and the outer layer is elastic to wrap the conductive wire inside.

3. The electronic net for security during transportation of claim 1, wherein the net body of electronic net is formed by connecting multiple subnets, the meshes at the edge of the adjacent subnets are cross woven and connected to each other, the conductive wires between subnets are connected in series, and the connection position is fixed by a sleeve; the end of the conductive wire of the first subnet and the end of the conductive wire of the last subnet are connected to the electronic lock.

4. The electronic net for security during transportation of claim 3, wherein the edge of the adjacent subnet is fixed by inserting and knotting with a braided wire along the meshes, and the conductive wire of the braided wire is also inserted to the conductive wire of the subnet.

5. The electronic net for security during transportation of claim 1, wherein the electronic lock is at least provided with a detection circuit for checking if the connection end is conductive, with the connection between the detection circuit and the electronic net, the conductive wire of the electronic net forms a loop, and when the electronic lock activates, the detection circuit outputs electrical signal to detect the loop, and sends out the corresponding error signal if the interruption occurs.

6. The electronic net for security during transportation of claim 5, wherein the electronic lock is provided with a positioning circuit and a communication circuit, the communication circuit connects to satellite positioning circuit to obtain the positioning data, and it also connects to detection circuit to obtain fault signal, the communication circuit transmits the positioning data and error signal to the remote server by wireless network.

7. A weaving method of the electronic net for security during transportation of claim 1, wherein the net body of the electronic net is of interlaced by the meshes and the knots between adjacent meshes, the weaving methods are as below:
  a. looping the braided thread to form the first mesh and tie it with a knot;
  b. looping the braided thread and get through the previous mesh to form a new mesh, and then tie a knot at the position where the braided thread passes the previous mesh to fix the new mesh to the previous mesh;
  c. repeating the step b to complete a row of mesh and knot structure;
  d. looping the braided thread along the vertical direction of the previous row of mesh and get through the corresponding mesh of the previous row to form a new mesh, and then tying a knot at the position where the braided thread passes the corresponding mesh of the previous row so as to fix the new mesh to the corresponding mesh of the previous row; looping the braided thread and getting through the corresponding mesh of previous row and the adjacent mesh in the same row to form a new mesh, and then tying a knot at the position where the braided thread passes the corresponding mesh of the previous row and the adjacent mesh in the same row to fix the new mesh to the corresponding mesh of the previous row and the adjacent mesh in the same row;
  e. repeating the step d to complete the net body.

* * * * *